United States Patent
Gallet et al.

(10) Patent No.: US 7,840,389 B2
(45) Date of Patent: Nov. 23, 2010

(54) METHOD OF OPTIMIZING STIFFENED PANELS UNDER STRESS

(75) Inventors: Celine Gallet, Tournefeuille (FR); Eric Bouchet, Aussonne (FR); Michel Salaun, Toulouse (FR)

(73) Assignee: Airbus France, Toulouse (FR)

( * ) Notice: Subject to any disclaimer, the term of this patent is extended or adjusted under 35 U.S.C. 154(b) by 530 days.

(21) Appl. No.: 11/969,557

(22) Filed: Jan. 4, 2008

(65) Prior Publication Data

US 2008/0164372 A1 Jul. 10, 2008

(30) Foreign Application Priority Data

Jan. 5, 2007 (FR) .................................. 07 52541

(51) Int. Cl.
*G06F 17/50* (2006.01)
(52) U.S. Cl. ........................... 703/1; 244/177; 244/119; 244/120
(58) Field of Classification Search ...................... 703/1; 702/42; 244/177, 119, 120
See application file for complete search history.

(56) References Cited

U.S. PATENT DOCUMENTS

| | | | | |
|---|---|---|---|---|
| 5,065,630 A * | 11/1991 | Hadcock et al. | ............... | 73/802 |
| 5,654,900 A * | 8/1997 | Ratner | ............... | 703/1 |
| 5,984,511 A * | 11/1999 | Vasey-Glandon et al. | ...... | 703/6 |
| 6,010,098 A * | 1/2000 | Campanile et al. | ........... | 244/219 |
| 6,125,333 A * | 9/2000 | Pun | ............... | 702/42 |
| 7,010,472 B1 * | 3/2006 | Vasey-Glandon et al. | ...... | 703/6 |
| 7,082,388 B2 * | 7/2006 | Omotani | ............... | 703/8 |
| 7,243,055 B2 * | 7/2007 | Chen et al. | ............... | 703/2 |
| 7,271,741 B2 * | 9/2007 | Delaplace et al. | ........... | 340/945 |
| 7,406,403 B2 * | 7/2008 | Fox et al. | ............... | 703/1 |
| 7,467,070 B2 * | 12/2008 | Meyer et al. | ............... | 703/1 |
| 7,668,701 B2 * | 2/2010 | Latova et al. | ............... | 703/1 |
| 7,689,388 B2 * | 3/2010 | Dong | ............... | 703/2 |
| 7,735,779 B2 * | 6/2010 | Griess et al. | ............... | 244/119 |
| 2002/0069040 A1 * | 6/2002 | Omotani | ............... | 703/8 |
| 2003/0158676 A1 * | 8/2003 | Fields et al. | ............... | 702/42 |
| 2004/0073411 A1 * | 4/2004 | Alston et al. | ............... | 703/1 |
| 2006/0249626 A1 * | 11/2006 | Simpson et al. | ........... | 244/123.1 |
| 2006/0282234 A1 * | 12/2006 | Pottage | ............... | 703/1 |
| 2008/0004843 A1 * | 1/2008 | Pozuelo Cabrera | ............ | 703/1 |

OTHER PUBLICATIONS

M.E. Biancolini, C. Brutti, E. Mottola, S. Porziani, "Numerical evaluation of buckling and post-buckling behaviour of corregated board containers" University of Rome, Department of Mechanical Engineering, Sep. 14-17, 2005, 13 pages.*

(Continued)

*Primary Examiner*—Dwin M Craig
(74) *Attorney, Agent, or Firm*—Perman & Green LLP

(57) ABSTRACT

The subject of the disclosed embodiments is a method of optimizing stiffened panels under stress. In particular, the method makes it possible to determine the stress distribution in stiffened panels with postbuckling taken into account. The method proposed is a coupling between an overall, linear stress calculation approach, based on strength-of-materials results, and a local, nonlinear approach for the behavior of the stiffened panel. The disclosed embodiments fall within the field of aeronautical design, at the pilot study stage in the definition of a civil transport airplane of conventional architecture.

11 Claims, 2 Drawing Sheets

OTHER PUBLICATIONS

Merval Antoine et al: "Application of response surface methodology to stiffened panel optimization" Collection of Technical Papers—AIAA/ASME/ASCE/AHS Structures, Structual Dynamics and Materials Conference, AIAA, Washington, DC, US vol. 4, 2006, pp. 2686-2696, XP 009088907 ISSN: 0273-4508.

Sobieszczanski-Sobieski Jaroslaw et al: "Structual Optimization by Multilevel Decomposition" AIAA Journal, American Institute of Aeronautics and Astronautics, US, vol. 23, No. 11, Nov. 1985, pp. 1775-1782, XP 009089142 ISSN:0001-1452.

Gallet C et al: "An Example of Global Structural Optimisation With Genetic Algorithms in the Aerospace Field" Proceedings of the International Conference on Computational Plasticity, X, XX vol. 8th, No. part 2, Sep. 5, 2005, pp. 1019-1022, XP009088657.

* cited by examiner

METHOD OF OPTIMIZING STIFFENED PANELS UNDER STRESS

BACKGROUND

1. Field

The disclosed embodiments relate to a method of optimizing the design of stiffened panels under stress that takes account of postbuckling on the overall scale of the fuselage.

2. Brief Description

The aspects of the disclosed embodiments include calculating the mass associated with the design criteria for panels under various loading situations. In particular, the method is intended to minimize the mass of stiffened panels taking postbuckling into account and respecting the rigidity and buckling-resistance criteria.

These disclosed embodiments come within the context of a pilot study so as to be able to evaluate, qualitatively and rapidly, new technologies and structural sensitivity studies for the purpose of shortening the development cycle for the stiffened panels that make up the fuselage of an airplane.

FIGS. 2A and 2B describe such stiffened panels. They generally consist of skins 4 reinforced in the longitudinal and orbital directions by stiffeners 3, called stringers and frames respectively. The presence of these reinforcements is intended to protect the structure from buckling phenomena and to limit crack propagation.

To obtain increasingly lightweight and strong structures, the panels resulting from optimization procedures are slender structures, and therefore liable to buckle beyond a critical load. During structural certification trials for example, generally carried out on the overall scale of the fuselage, local buckling zones are observed in the skin, forming "blisters" 6 between the stiffeners. With increasing load, these nonlinear zones may extend and cause stresses to be redistributed within the structure. For the service loads commonly encountered, these phenomena are reversible, the material remaining within the elastic region. However, they may cause stress concentrations at the bases of the stiffeners and be the cause of local disbanding, leading to general failure.

To meet the safety margins of the installation, it is therefore essential that the instability phenomena due to buckling be taken into account in the method of optimizing the design of these stiffened panels.

The problem of optimizing these large structures on the overall scale is a nonlinear problem which is complex both from its solution and from its definition, and which must take into account many criteria. Within the context of aeronautical structures for example, mass, rigidity and buckling-resistance criteria must be optimized, while still taking into account the design cost of these structures. Consequently, by dint of the large number of variables and the stresses involved, the optimization methods employed are expensive in terms of computing time.

Conventional panel design optimization methods do not generally incorporate the phenomenon of postbuckling in order to circumvent limitations in computing power and computing time.

The iterative method, in which only buckling in compression is taken into account, is also known, but this is a purely theoretical case.

Also known is the approach based on two levels—namely an overall, linear analysis level and a local, nonlinear analysis level in regions of local interest—but this two-level approach is limited owing to the fact that it makes it possible to deal only with localized nonlinearities that have no influence on the overall response.

The aspects of the disclosed embodiments provide an optimization method which is simple in its design and in its operating mode, is economical in terms of computing time and is flexible and capable of defining an optimum strategy in terms of mass in the design of a panel, whilst still taking account of the postbuckling that causes stress redistribution between frames.

SUMMARY

The disclosed embodiments propose a method that provides coupling between two approaches:

a linear overall approach for computing stresses, based on strength-of-materials results; and a nonlinear local approach for the behavior of the stiffened panel.

In particular, this method makes it possible for the position of the uniformized neutral bending Axis in a fuselage ring to be determined analytically by successive iterations, taking into account the loss of rigidity of the buckled panels. The final stress distribution thus obtained takes account of the postbuckling of the stiffened panels.

For this purpose, the disclosed embodiments relate to a method of optimizing the design of stiffened panels intended for the fuselage of an aircraft under load, said fuselage being divided up into a set of rings j, each ring being decomposed into subsystems, each subsystem being composed of a stiffener and a skin portion to which said stiffener is fastened, said subsystem being subjected to a combined loading of compression and shear stress.

According to the disclosed embodiments said method comprises the following successive steps:

a) the local characteristics of the ith subsystem in the initial state, corresponding to a state with no buckling, are determined;

b) the initial overall characteristics of the ring are determined, namely the initial offset of its neutral bending axis $\Delta Z_0$, its static moment $[EW]_0$ and its flexural rigidity $[EI]_0$ are determined from the local characteristics of the ith subsystem;

c) the following are determined in an iterative loop and each iteration n:

the working local characteristics of the subsystem taking into account the loss of rigidity due to buckling, and the new overall characteristics of the ring, namely its offset $[\Delta Z_0]_n$, its flexural rigidity $[EI]_n$ and its static moment $[EW]_n$, the convergence of the iterative loop being obtained if the new offset is below a threshold, for example the threshold may be set at 1% of the radius of curvature of the stiffened panel;

d) the final stress distribution in the subsystem is determined;

e) the safety margins are determined from the final stress distribution in the subsystem taking postbuckling into account;

f) the mass function of the subsystem is minimized while respecting the safety margins.

The disclosed embodiments also relate to a stiffened panel produced on the basis of the structural parameters optimized by the method described above and to the use of such a panel for equipping an aeronautical structure.

BRIEF DESCRIPTION OF THE DISCLOSED EMBODIMENTS

The disclosed embodiments will be described in greater detail with reference to the appended drawings in which.

DETAILED DESCRIPTION

Figure 1:
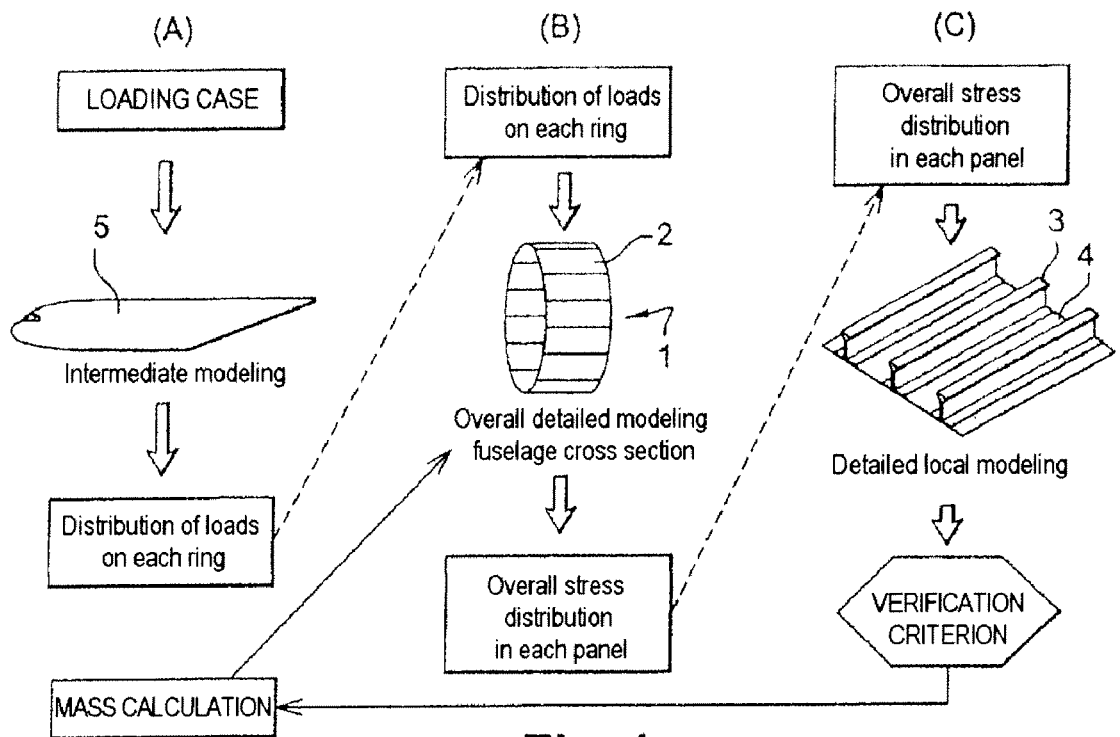
FIG. 1 shows a scheme for the design optimization of stiffened panels on the overall scale of an airplane fuselage.

FIG. 1 shows a scheme of the method of optimizing stiffened panels intended for the fuselage 5 of an aircraft under load. The principle of the method is based on the fact of dividing the optimization method into several levels, each of the levels making it possible to obtain results that are used in the next level. Furthermore, for each level, a specific computing tool suitable for optimizing the computing time is used.

The fuselage is cut up into rings 1, which are also cut up into a set of subsystems 2, and the load distribution on each ring is determined (A). Next, in an iterative loop, the overall stress distribution in each panel is firstly determined on the basis of overall modeling of a ring (B), then the local characteristics of each panel are determined from a local modeling, and the stress distribution in each panel is determined while taking into account the loss of rigidity of the buckled panels on the basis of the local characteristics (C). When the safety criterion is satisfied, the mass of the stiffened panels is then calculated from the dimensions and the density of the constituent materials of the panels, taking into account the safety margins to be met.

Figure 2A:
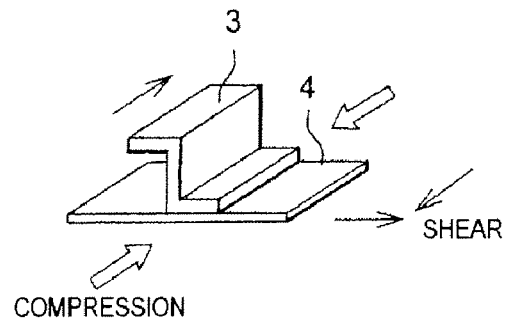
FIGS. 2A and 2B show the behavior of the stiffened panels subjected to a compressive load and to a shear stress.
Figure 2B:
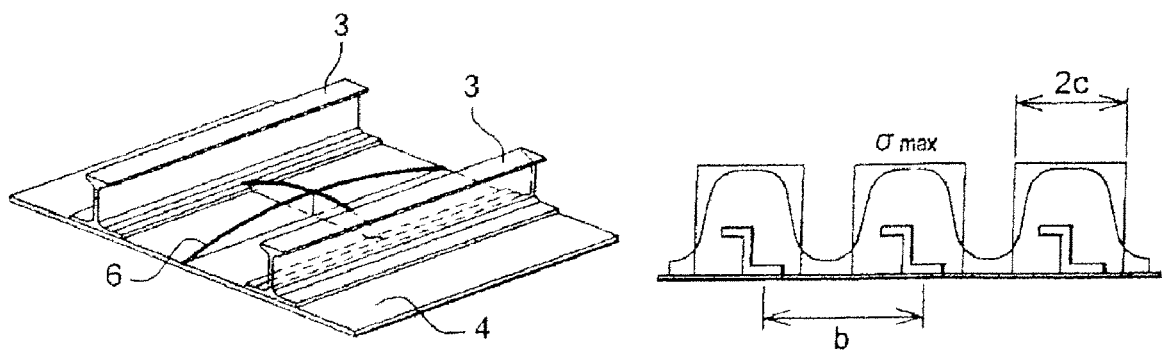

FIG. 2A shows a stiffened panel in the presence of two stressing modes: compression and shear. FIG. 2B shows the stress state of the stiffened panel under compression. When the applied stress reaches the critical blistering stress, blisters 6 form between the stiffeners 3 in the buckling regions of the skin 4 of the stiffened panel. For stresses above the critical blistering stress, these nonlinear zones extend and cause stress redistribution in the structure. The loss of rigidity of the compressed panels is determined using the principle of "working widths". This loss of rigidity of the unstable panels is therefore greater than in the case in which only buckling in pure compression is considered.

The principle of the method of the disclosed embodiments is the following: the critical stresses of each panel under combined load are calculated. Since these stresses are known, it is possible to calculate the working widths and the associated cross sections in compression for buckled panels in an iterative loop. Once convergence has been reached, the working widths in shear are calculated so as to determine the additional compressive stresses, both in the stringers and the frames, which result from the skin folding.

First Iteration

It is assumed that initially the panels have not buckled. The flexural rigidity and the uniformized static moment of the ring and also the associated compressive and shear stresses are determined using long-beam theory.

Following Iterations

In the following iterations, starting from the calculated compressive and shear stresses and the critical buckling stresses under simple loading, the critical stresses under combined loading are determined. The associated working widths in compression are then determined and also the working cross sections using the de von Karman model. Once the working characteristics of the ring have been calculated, the compressive and shear stresses are determined.

The convergence criterion is met when the position of the neutral axis no longer changes.

The folding of the skin under shear stresses generates additional compressive stresses in the stringers and the frames. Once convergence has been reached and the final stress state obtained, these additional stresses are calculated from the formulae established in the study on the stability of stiffened panels in shear.

Figure 3:
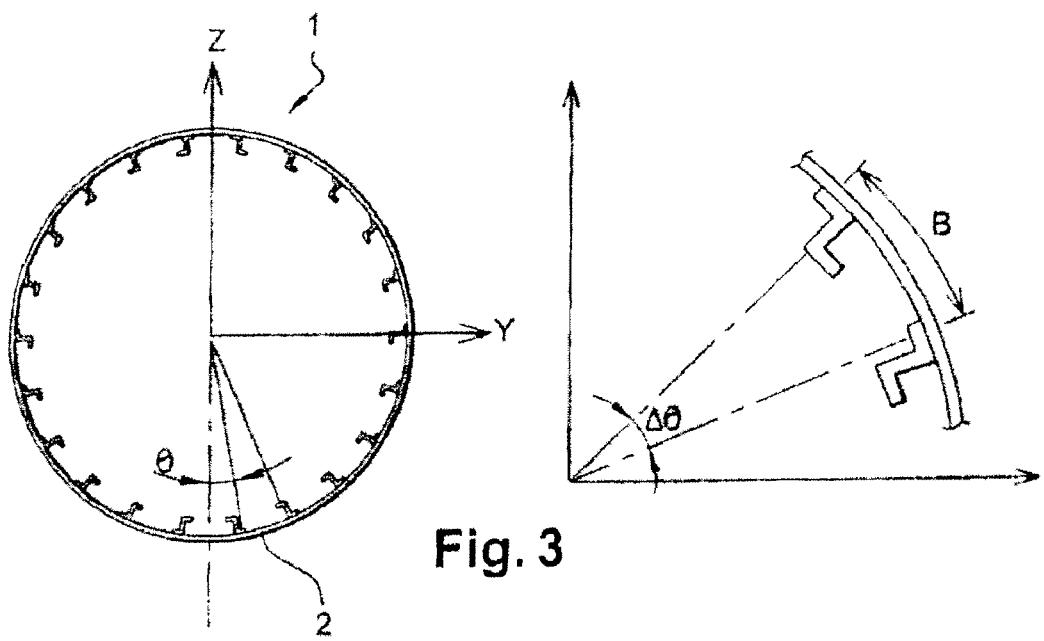
FIG. 3 shows schematically the decomposition of a fuselage ring into subsystems.

FIG. 3 shows a front view of a fuselage ring decomposed into subsystems 2 consisting of a stiffener and a skin portion to which a stiffener is fastened, the subsystem being subjected to a combined loading made up of compression and shear stress, the loading in the example presented here being of the $[M_y, T_z, M_x]$ type.

The subsystem is defined by two types of variables:

quantitative variables which are geometric variables including discrete variables and continuous variables—in total, each stiffened panel has 13 geometric variables; and qualitative variables: type of materials, technology for assembly between the skin and the stiffener.

Within the context of the method, to simplify the modeling, the thicknesses of the skin and of the stiffener are normalized by equivalence to a single thickness $$e_{equi} = e_{panel}\sqrt{\frac{\sigma_{blist}}{\sigma_b}}$$

The main steps of the method are explained in detail below.

According to the disclosed embodiments, the method of optimizing the design of panels comprises the following successive steps:

a) the local characteristics of the ith subsystem in the initial state, corresponding to a state with no buckling, are determined:

$\begin{bmatrix} S_p^i: & \text{cross section of the skin in the } ith \text{ subsystem} \\ S_r^i: & \text{cross section of the stiffener in the } ith \text{ subsystem} \\ E_{equi}^i: & \text{Young's modulus of } ith \text{ subsystem} \\ Z_{Ginit}^i: & \text{initial dimension of the centre of gravity of the } ith \text{ subsystem} \\ Ei_{Gyy}^i: & \text{flexural rigidity of the } ith \text{ subsystem} \\ EW_{Gyy}^i: & \text{static moment of the } ith \text{ subsystem} \\ \sigma_{blist}^i: & \text{critical blistering stress in pure compression} \\ \tau_{fold}^i: & \text{critical folding stress in pure shear;} \end{bmatrix}$ b) the initial overall characteristics of the ring are determined, namely the initial offset of its neutral bending axis $\Delta Z_0$, its static moment $[EW]_0$ and its flexural rigidity $[EI]_0$ are determined from the local characteristics of the ith subsystem;

c) the following are determined in an iterative loop and at each iteration:

the working local characteristics of the ith subsystem taking into account the loss of rigidity due to the buckling:

the working width of the ith panel at the nth iteration:

$$(c^i)_n = (c^i)_n = \frac{b_i}{2}\sqrt{\frac{(\sigma^i_{blist})_n}{(\sigma_{max})_n}}\ ; \text{and}$$

the working cross section $(S^i)_n$ of the skin of the ith subsection at the nth iteration;

and also the other local characteristics:

$\begin{bmatrix} (\sigma^i_{blister})_n: & \text{blistering stress under combined loading of the } ith \text{ subsystem at the } nth \text{ iteration;} \\ (\tau^i_{fold})_n: & \text{folding stress under combined loading of the } ith \text{ subsystem at the } nth \text{ iteration;} \\ (E^i_{equi})_n: & \text{Young's modulus of the } ith \text{ subsystem at the } nth \text{ iteration;} \\ (Z^i_G)_n: & \text{dimension of the centre of gravity of the } ith \text{ subsystem at the } nth \text{ iteration;} \\ (EI^i_{Gyy})_n: & \text{flexural rigidity of the } ith \text{ subsystem at the } nth \text{ iteration;} \\ (EW^i_{Gyy})_n: & \text{static moment of the } ith \text{ subsystem at the } nth \text{ iteration;} \end{bmatrix}$ the new overall characteristics of the ring, namely its new offset $[\Delta Z_0]_n$, its flexural rigidity $[EI]_n$ and its static moment $[EW]_n$, the convergence of the iterative loop being obtained if the new offset is below a threshold, set for example at 1% of the radius of curvature of the stiffened panel;

d) the final stress distribution in the subsystem is determined;

e) the safety margins are determined from the final stress distribution in the subsystem taking postbuckling into account;

f) the mass function of the subsystem is minimized while respecting the safety margins.

In step f), an algorithm having continuous variables based on the gradient of a functional is used for minimizing the mass of the ring.

It is also possible to use a genetic algorithm for minimizing the mass of the ring when it is additionally desired to take the qualitative variables into consideration An application example of the method is presented below, this making it possible to quantify the error committed when the local buckling of the skin is not taken into account. The stresses obtained with the linear models conventionally used are compared with the model of the disclosed embodiments, in which the loss of stiffness of the panels due to the buckling is taken into account. This comparison is carried out for various rings subjected to a pure flexural loading $[M_y]$ and a combined loading $[M_y, T_z, M_x]$. The comparison was made on an inter-frame region of the fuselage of a long-haul airplane, the characteristics of which are the following:

radius=2820 mm;
number of stringers=109;
inter-stringer spacing 162.56 mm (uniform distribution);
cross section of the stiffeners=100 mm;
web thickness=1.4 mm;
2024PLT351 aluminum skin; and
7075T73510 aluminum stiffeners.

The stability characteristics of the stiffened panels in the configuration tested are the following:

blistering stress $\sigma_{blist}$=26 MPa;
critical stability stress $\sigma_{critic}$=141 MPa.

Figure 4:
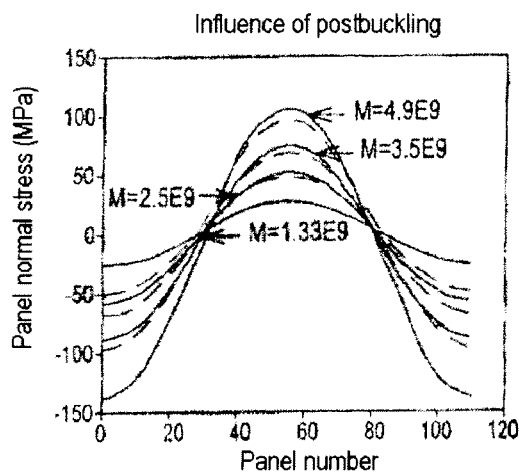
FIG. 4 shows a study comparing the stresses with and without postbuckling.

The stresses are calculated using a conventional linear method and the method of the disclosed embodiments for moments taken within the $[M_{blist}, M_{critic}]$ interval, where $M_{blist}$ and $M_{critic}$ are respectively the flexural moments associated with blistering and with failure of the most compressed panel. For each of the applied moments, the differences between the maximum stresses in the most loaded panel were measured. FIG. 4 shows the stresses in the skin calculated using the linear method and the method integrating buckling, for four values of the flexural moment located within the $[M_{blist}, M_{critic}]$ interval.

The difference between the maximum compressive stress is obtained with the linear model (dashed lines) and with the model incorporating buckling (solid lines) is greater the larger the applied flexural moment.

Figure 5:
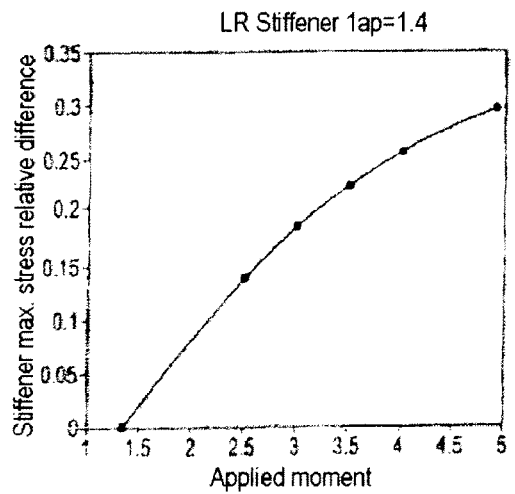
FIG. 5 is a curve of the differences between the maximum stresses with postbuckling and the maximum stresses without postbuckling as a function of the applied moment.

FIG. 5 shows the maximum relative differences obtained for the various moments have been recorded. For an applied moment equal to $M_{blist}$, the observed difference is zero. This is normal since it corresponds to the blistering limit and the conventional methods and the proposed method coincide when there is no instability in the panel. For applied moments above $M_{blist}$, the difference increases until reaching 30% in the case studied. Thus, the conventional methods lead to nonconservative results with errors that may be substantial.

The method of the disclosed embodiments can be applied to a metal panel, but also to a composite panel.

Advantageously, although the problem is divided into several levels of optimization, between each level there is information exchanged so that the problematic approach proposed by the method of the disclosed embodiments remains a coupled problem approach.

The method makes it possible to provide optimized structural parameters for the design of a stiffened panel produced with a relatively short computing time—the panel thus obtained has a minimal mass while still meeting the safety margins.

Such a stiffened panel may be used in all industrial sectors for furnishing equipment that has to have very particular, or even opposing, mechanical characteristics so as to ensure its performance. Thus, these stiffened panels contribute even more to enhancing safety thanks to better buckling behavior while still contributing to minimizing the mass of the structural components, which constitutes one of the essential challenges in the aeronautical industry.

The invention claimed is:

1. Method of optimizing the design of stiffened panels intended for the fuselage of an aircraft (5) under load, said fuselage being divided up into a set of rings (1), each ring being decomposed into subsystems (2), each subsystem being composed of a stiffener (3) and a skin portion (4) to which said stiffener is fastened, said subsystem (2) being subjected to a combined loading of compression and shear stress, characterized in that said method comprises the following successive steps:
- a) the local characteristics of the ith subsystem in the initial state, corresponding to a state with no buckling, are determined;
- b) the initial overall characteristics of the ring are determined, namely the initial offset of its neutral bending axis $\Delta Z_0$, its static moment $[EW]_0$ and its flexural rigidity $[EI]_0$ are determined from the local characteristics of the ith subsystem;
- c) the following are determined in an iterative loop and each iteration n:
  - the working local characteristics of the subsystem taking into account the loss of rigidity due to buckling, and
  - the new overall characteristics of the ring, namely its offset $[\Delta Z_0]_n$, its flexural rigidity $[EI]_n$, and its static moment $[EW]_n$, the convergence of the iterative loop being obtained if the new offset is below a threshold;
- d) the final stress distribution in the subsystem is determined;
- e) the safety margins are determined from the final stress distribution in the subsystem taking postbuckling into account; and
- f) the mass function of the subsystem is minimized while respecting the safety margins.

2. Method according to claim 1, characterized in that step f) uses an algorithm based on the gradient of a functional for minimizing the mass of the ring.

3. Method according to claim 1, characterized in that step f) uses a genetic algorithm for minimizing the mass of the ring.

4. Method according to claim 1, characterized in that the local characteristics of the ith subsystem are the following:
cross section of the skin;
cross section of the stiffener;
Young's modulus;
initial dimension of the center of gravity;
flexural rigidity;
static moment;
critical stress for blistering in compression; and
critical stress for folding in pure shear.

5. Method according to claim 1, characterized in that the working characteristics of the ith subsystem are the following:
working width $$(c^1)_n = (c^i)_n = \frac{b_i}{2} \sqrt{\frac{(\sigma^i_{blist})_n}{(\sigma_{max})_n}} \text{; and}$$

working cross section $(S^i)_n$ of the skin.

6. Method according to claim 1, characterized in that the subsystem is defined by two types of variables:
quantitative variables which are geometric variables; and
qualitative variables.

7. Method according to claim 1, characterized in that said method uses a thickness determined by equivalence corresponding to:

$$e_{equi} = e_{panel} \sqrt{\frac{\sigma_{blist}}{\sigma_b}}.$$

8. Method according to claim 1, characterized in that said threshold is set at 1% of the radius of curvature of the stiffened panel.

9. Stiffened panel produced on the basis of the design parameters optimized by said method according to claim 1.

10. Panel according to claim 9, characterized in that said panel is a composite panel.

11. Use of said composite panel produced according to claim 10 for equipping an aircraft.

* * * * *

UNITED STATES PATENT AND TRADEMARK OFFICE
CERTIFICATE OF CORRECTION

PATENT NO. : 7,840,389 B2  Page 1 of 1
APPLICATION NO. : 11/969557
DATED : November 23, 2010
INVENTOR(S) : Gallet et al.

It is certified that error appears in the above-identified patent and that said Letters Patent is hereby corrected as shown below:

Title Page, Col. 2, (56) References Cited, Other Publications delete "corregated" and insert -- corrugated --, therefor.

Signed and Sealed this
Twenty-ninth Day of March, 2011

David J. Kappos
*Director of the United States Patent and Trademark Office*